(12) United States Patent
Shin et al.

(10) Patent No.: US 10,579,194 B2
(45) Date of Patent: Mar. 3, 2020

(54) APPARATUS AND METHOD FOR DETERMINING USER INPUT OF WEARABLE ELECTRONIC DEVICE USING BODY CONTACT INTERFACE

(71) Applicant: ELECTRONICS AND TELECOMMUNICATIONS RESEARCH INSTITUTE, Daejeon (KR)

(72) Inventors: Sung Yong Shin, Daejeon (KR); Jong Moo Sohn, Daejeon (KR); Chang Mok Oh, Seoul (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 19 days.

(21) Appl. No.: 15/934,848

(22) Filed: Mar. 23, 2018

(65) Prior Publication Data

US 2018/0275799 A1 Sep. 27, 2018

(30) Foreign Application Priority Data

Mar. 24, 2017 (KR) .......................... 10-2017-0037893

(51) Int. Cl.
*G06F 3/044* (2006.01)
*G06F 3/0488* (2013.01)
(Continued)

(52) U.S. Cl.
CPC .............. *G06F 3/044* (2013.01); *G06F 3/011* (2013.01); *G06F 3/014* (2013.01); *G06F 3/0219* (2013.01); *G06F 3/03547* (2013.01); *G06F 3/0418* (2013.01); *G06F 3/04883* (2013.01); *G06F 3/04886* (2013.01); *H03K 17/962* (2013.01); *H03K 17/9645* (2013.01); *H03K 2217/960755* (2013.01)

(58) Field of Classification Search
CPC ......... G06F 3/011; G06F 3/014; G06F 3/0219
See application file for complete search history.

(56) References Cited

U.S. PATENT DOCUMENTS

| 8,975,900 | B2 | 3/2015 | Poupyrev et al. | |
| 2010/0219989 | A1* | 9/2010 | Asami | G06F 3/014 341/20 |

(Continued)

FOREIGN PATENT DOCUMENTS

KR 10-2015-0065336 A 6/2015

*Primary Examiner* — Chun-Nan Lin (57) ABSTRACT

An electronic device capable of processing a user input without direct contact is disclosed. The electronic device according to an embodiment of the present disclosure may include a plurality of contact electrodes having one end thereof contacted with a user's body respectively to be electrically connected to the user's body, at least one body contact interface electrically connected to the plurality of contact electrodes through the user's body and having a predetermined impedance value, and a signal processing unit connected to other end of the plurality of contact electrodes respectively to form a circuit through the plurality of contact electrodes, the at least one body contact interface, and the user's body, and determining a user input corresponding to an impedance characteristic of the circuit.

18 Claims, 7 Drawing Sheets

(51) Int. Cl.
*G06F 3/01* (2006.01)
*G06F 3/041* (2006.01)
*H03K 17/96* (2006.01)
*G06F 3/0354* (2013.01)
*G06F 3/02* (2006.01)

(56) References Cited

U.S. PATENT DOCUMENTS

2011/0248773 A1* 10/2011 Poupyrev ............... G06F 3/011
                                                          327/517
2014/0129233 A1   5/2014 Chung et al.
2016/0232708 A1   8/2016 Kim et al.

* cited by examiner

APPARATUS AND METHOD FOR DETERMINING USER INPUT OF WEARABLE ELECTRONIC DEVICE USING BODY CONTACT INTERFACE

The present application claims priority to Korean Patent Application No. 10-2017-0037893, filed Mar. 24, 2017, the entire contents of which is incorporated herein for all purposes by this reference.

BACKGROUND OF THE INVENTION

Field of the Invention

The present disclosure relates generally to a wearable electronic device and, more particularly, to an apparatus for determining a user input in a wearable electronic device and a method for the same.

Description of the Related Art

A method using a capacitive touch sensor as a user interface for controlling electronic devices has been widely used. In order to control the electronic device using the capacitive touch sensor provided in the electronic device, it may cause an inconvenience that a user has to directly touch the touch sensor of the electronic device.

Particularly, when the touch sensor is provided in a wearable glass device worn by a user, the user may unintentionally touch the touch sensor provided in the device, thereby causing a shock to the device. As a result, it causes a movement in the wearable glass device, and thus the user's view may be interrupted.

On the other hand, user commands for controlling functions of the device generally correspond to a touch number, a touch position, and a swipe. However, since the mutual correspondence relationship therebetween is not intuitive, the user may have a difficulty in memorizing the correspondence or a possibility of entering the user commands mistakenly.

SUMMARY OF THE INVENTION

Although the wearable glass device has developed a technology of determining a user input in a non-contact manner without a touch sensor, there are disadvantages in that it is difficult to accurately determine the user input or the user input capable of being determined is limited.

The present disclosure has been made in view of the foregoing points, and it is an object of the present disclosure to provide an apparatus that can accurately determine a user input even if the user does not touch the electronic device.

The present disclosure also has another object to provide a device that enables a user to set various user inputs using user's body.

In addition, the present disclosure has another object to provide a device that enables a user to variously set the user input by using proprioception or reflecting convenience of individual users.

The technical objects to be achieved by the present disclosure are not limited to the technical matters mentioned above, and other technical subjects that are not mentioned are to be clearly understood by those skilled in the art from the following description.

An electronic device according to an aspect of the present disclosure may include a plurality of contact electrodes having one end thereof contacted with a user's body respectively to be electrically connected to the user's body, at least one body contact interface electrically connected to the plurality of contact electrodes through the user's body and having a predetermined impedance value; and a signal processing unit connected to other end of the plurality of contact electrodes respectively to form a circuit through the plurality of contact electrodes, the at least one body contact interface, and the user's body, and determining a user input corresponding to an impedance characteristic of the circuit.

A method of processing a signal of an electronic device according to another aspect of the present disclosure may include generating a predetermined signal, outputting the predetermined signal to a circuit formed through a plurality of contact electrodes, at least one body contact interface, and a user's body, detecting a signal reflecting an impedance characteristic provided in the circuit, and determining a user input corresponding to a characteristic of the detected signal.

The features briefly summarized above for this disclosure are only exemplary of the detailed description of the disclosure which follows, and are not intended to limit the scope of the disclosure.

According to the present disclosure, it is possible to determine various user inputs accurately, even if the user does not touch the electronic device.

Further, according to the present disclosure, the user can set various user inputs using user's body.

Further, according to the present disclosure, since the user inputs the user input by using proprioception, it is possible to provide an environment in which the user can more intuitively control the electronic device.

Further, since the user can variously set user inputs by reflecting convenience of individual users, convenience of individual users may be improved and the usability of the electronic device may be also improved. The effects obtainable in the present disclosure are not limited to the effects mentioned above, and other effects not mentioned may be clearly understood by those skilled in the art from the description described below.

BRIEF DESCRIPTION OF THE DRAWINGS

The above and other objects, features and other advantages of the present disclosure will be more clearly understood from the following detailed description when taken in conjunction with the accompanying drawings, in which.

DETAILED DESCRIPTION OF THE INVENTION

Hereinbelow, embodiments of the present disclosure will be described in detail so that those skilled in the art can easily carry out the present disclosure referring to the accompanying drawings. However, the present disclosure may be embodied in many different forms and is not limited to the embodiments described herein.

In the following description of the embodiments of the present disclosure, a detailed description of known functions and configurations incorporated herein will be omitted when it may make the subject matter of the present disclosure unclear. Parts not related to the description of the present disclosure in the drawings are omitted, and similar parts are denoted by similar reference numerals.

In the present disclosure, when an element is referred to as being "connected", "coupled", or "connected" to another element, it is understood to include not only a direct connection relationship but also an indirect connection relationship. Also, when an element is referred to as "containing" or "having" another element, it means not only excluding another element but also further including another element.

In the present disclosure, the terms first, second, and so on are used only for the purpose of distinguishing one element from another, and do not limit the order or importance of the elements unless specifically mentioned. Thus, within the scope of this disclosure, the first component in an embodiment may be referred to as a second component in another embodiment, and similarly a second component in an embodiment may be referred to as a first component in another embodiment.

In the present disclosure, components that are distinguished from one another are intended to clearly illustrate each feature and do not necessarily mean that components are separate. That is, a plurality of components may be integrated into one hardware or software unit, or a single component may be distributed into a plurality of hardware or software units. Accordingly, such integrated or distributed embodiments are also included within the scope of the present disclosure, unless otherwise noted.

In the present disclosure, the components described in the various embodiments do not necessarily mean essential components, but some may be optional components. Accordingly, embodiments consisting of a subset of the components described in an embodiment are also included within the scope of this disclosure. Also, embodiments that include other components in addition to the components described in the various embodiments are also included in the scope of the present disclosure.

Hereinafter, embodiments of the present disclosure will be described with reference to the accompanying drawings.

Figure 1:
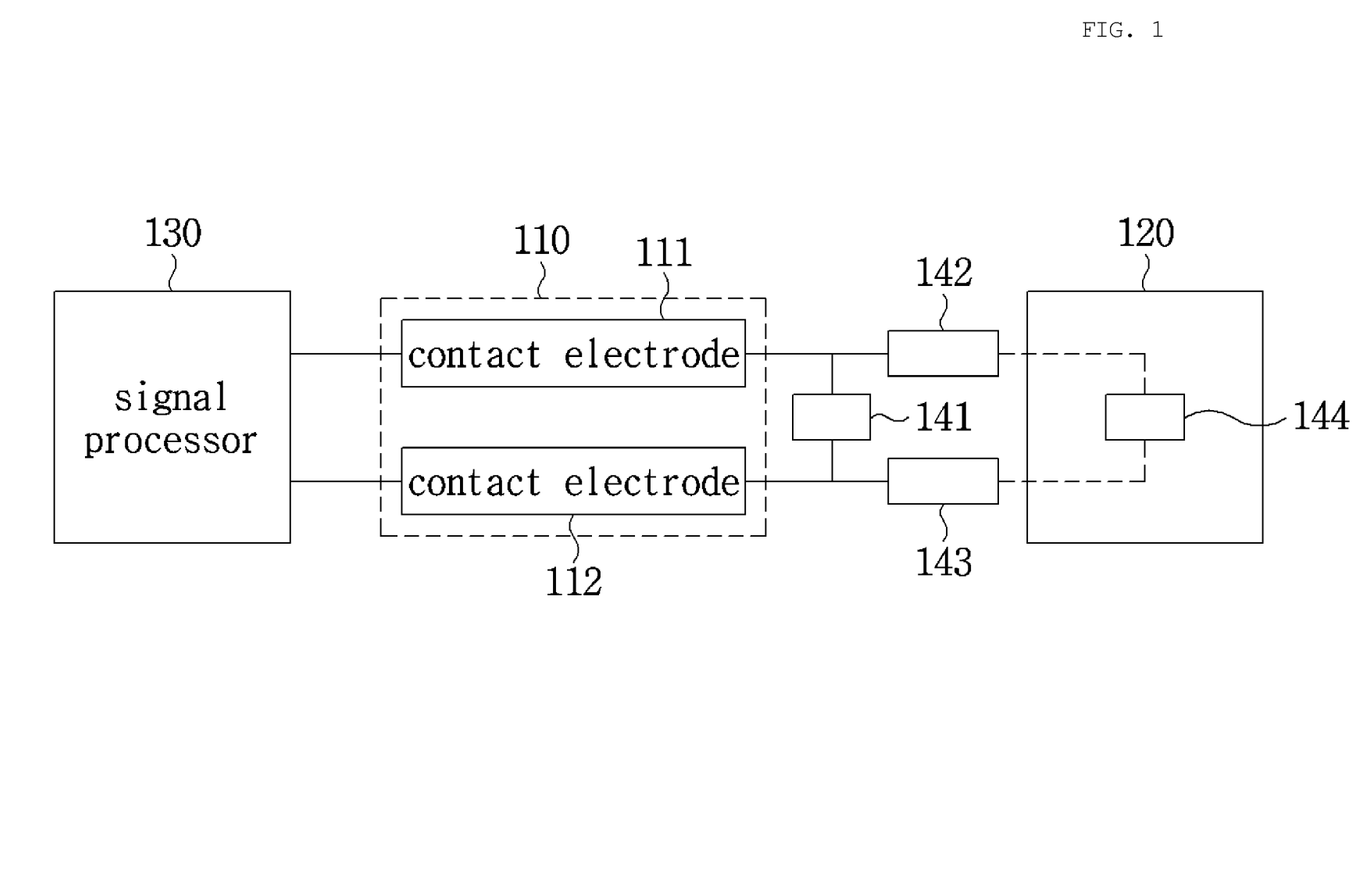
FIG. 1 is a block diagram illustrating a wearable device according to an embodiment of the present disclosure.

FIG. 1 is a block diagram illustrating a wearable device according to an embodiment of the present disclosure. Referring to FIG. 1, the wearable device according to an embodiment of the present disclosure may include a contact electrode 110, a body contact interface 120, and a signal processing unit 130.

The contact electrode 110 may be provided at a position in contact with a body of a user in a state that the user wears the wearable device 100. The contact electrode 110 may include at least two electrodes 111 and 112, in which at least one electrode 111 may be connected to a ground terminal provided in the signal processing unit 130, and at least one electrode 112 may be connected to a circuit terminal that outputs a signal in the signal processing unit 130.

The body contact interface 120 may be a passive sensor mounted or attached to an area of the body of the user, which does not require a power source.

At least two electrodes 111 and 112 provided in the contact electrode 110 are electrically connected to the body of the user and the signal processing unit 130, and the body contact interface 120 may be electrically connected to the body of the user. Accordingly, the signal processing unit 130, the contact electrode 110, the body contact interface 120, and the body of the user are electrically connected to form a circuit.

Due to electrical connections of the signal processing unit 130, the contact electrode 110, the body contact interface 120, and the body of the user that are mentioned above, a first impedance 141 between two electrodes 111 and 112, a second impedance 142 between the second electrode 112 and the body contact interface 120, a third impedance 143 between the first electrode 111 and the body contact interface 120, and a fourth impedance 144 of the body contact interface 120 itself may be formed.

The signal processing unit 130 may generate and supply a predetermined electric signal to the circuit, and detect a signal detected in the circuit. The body is used as an object for transmitting the electric signal in the circuit, in which a change may occur in a signal (for example, an impedance value, or a change amount of an impedance value) detected in the closed loop by the movements or contacts of the body. Accordingly, the signal processing unit 130 may measure a signal (e.g., an amount of change in impedance value or impedance value) detected in the circuit and determine a user input corresponding to the measured signal (e.g., a touch area, a gesture input).

The signal processing unit 130 may determine a user input corresponding to the measured signal (e.g., a touch area, a gesture input) and process an operation corresponding to the user input. For example, the operation corresponding to the user input may include an operation of adjusting a volume of the device, an operation of adjusting a brightness of the device, and the like. Further, the operation corresponding to the user input may be preset by a designer or a manufacturer of the wearable device, or may be variously set by the user.

Furthermore, the wearable device may be wired or wirelessly connected to other devices (e.g., portable terminal, personal computer, and laptop computer). Accordingly, the signal processing unit 130 may generate a signal for controlling the other device, and may provide the generated signal to the other device through wired/wireless communication. For example, the signal for controlling the other device may be a signal indicating the user input (e.g., a signal touching a first area, an input dragging the first area in a first direction, an input dragging the first area in a second direction, signal touching the first area twice, and the like), or signal indicating an operation of the other device (e.g., a volume increasing operation in the device, a volume decreasing operation in the device, a brightness increasing operation in a screen of the device, a brightness decreasing operation in the screen of the device, and the like).

Although an embodiment of the present disclosure is shown that the body contact interface 120 is mounted or attached to the body, the present disclosure is not so limited thereto. In one embodiment of the present disclosure, even though the body contact interface 120 is not attached to the body, it is sufficient that one end thereof may contact the body. For example, the body contact interface 120 may be configured as a wearable device or accessory type that may contact the body. For example, the body contact interface 120 may be provided in or attached to a portion of the body of the user that is in contact with a pair of glasses, a watch, a ring, a bracelet, an ear hook, and the like that are commonly used.

Figure 2:
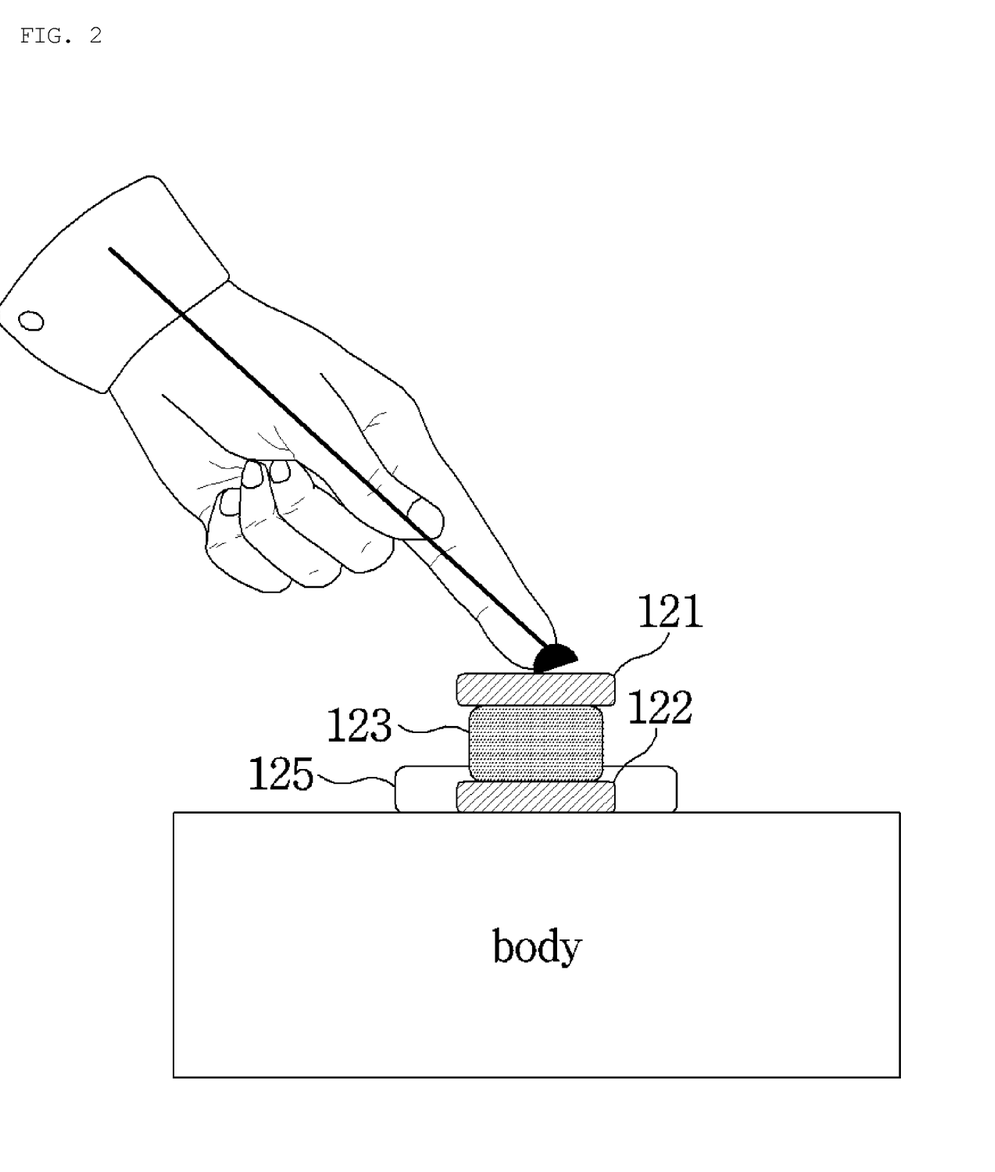
FIG. 2 is a view illustrating a detailed configuration of a body contact interface provided in a wearable device according to an embodiment of the present disclosure.

FIG. 2 is a view illustrating a detailed configuration of a body contact interface provided in a wearable device according to an embodiment of the present disclosure.

Referring to FIG. 2, the body contact interface 120 may have a conductive material and thus be configured to be electrically conductive. The body contact interface 120 may include at least one pair of electrode plates, for example, first and second electrode plates 121 and 122, a changing unit 123 provided in a space formed between the first electrode plate 121 and a second electrode plate 122 and having a predetermined impedance value, and an attachment member 125 for attaching and fixing the body contact interface to the body of the user.

In the above-described structure, as the body contact interface 120 is attached or fixed to the body of the user, the second electrode plate 122 may be positioned in an area attached or fixed to the body and the first electrode plate 121 may be positioned in an area exposed electromagnetically to the outside.

When a portion of the body of the user (e.g., a finger) electromagnetically contacts the first electrode plate 121 (or the area adjacent to the first electrode plate 121), the portion of the body of the user (e.g., a finger) may be electrically connected to the area of the body to which the second electrode plate 122 is attached or fixed through the first electrode plate 121, the changing unit 123, and the second electrode plate 122. Accordingly, a change occurs in the impedance value formed between the contact electrodes 110 and 120 provided in the wearable device to contact the body, based on the impedance value of the changing unit 123, whereby a change in the signal provided in the signal processing unit 130 may occur.

In this manner, by attaching the body contact interface 120 to body of the user, it is possible to variously detect the areas where the portion of the user's body (e.g., a finger) contacts.

Further, the impedance value of the changing unit 123 can be variously changed according to a material or a configuration method provided in the changing unit 123. For example, the impedance value of the changing unit 123 may be determined by variously combining resistors, capacitors, and inductor elements in a serial/parallel manner. Alternatively, the changing unit 123 having various impedance values may be configured by varying combination and layer structure of resistive and capacitive flexible thin film materials that are easily attached to the body.

Subsequently, the signal processing unit 130 may more accurately detect an area where a portion of the user's body (e.g., finger) contacts, by setting the impedance value of the changing unit 123 variously and attaching the changing unit 123 to a portion of the user's body.

The attachment member 125 may have a material enough to allow the second electrode plate 122 to be closely fixed to the user's body. The attachment member 125 may be provided between the second electrode plate 122 and the changing unit 123, or may be provided in an upper end of the first electrode plate 121.

Figure 3A:
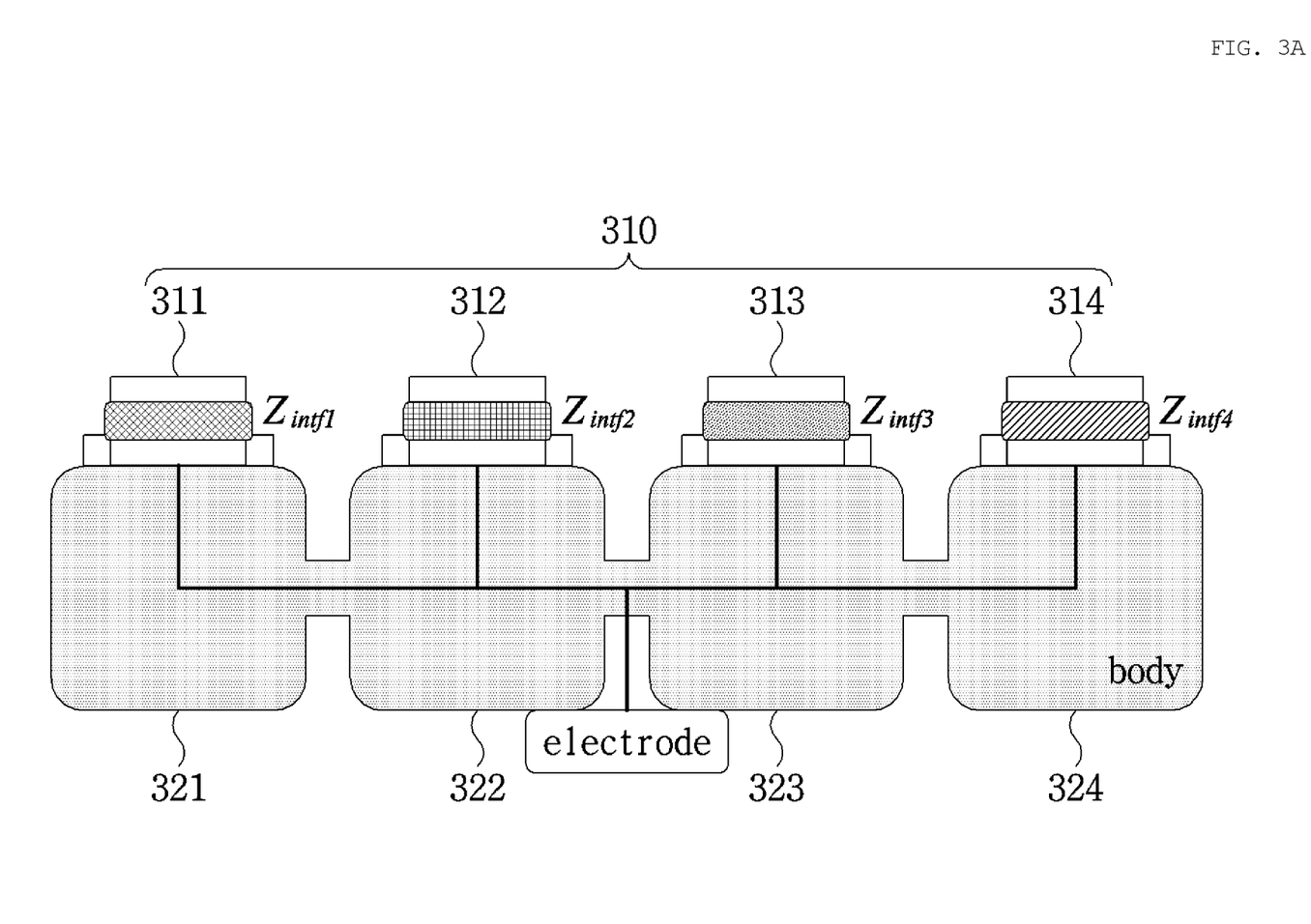
FIG. 3A is an exemplary view showing an arrangement of a body contact interface provided in a wearable device according to an embodiment of the present disclosure.
Figure 3B:
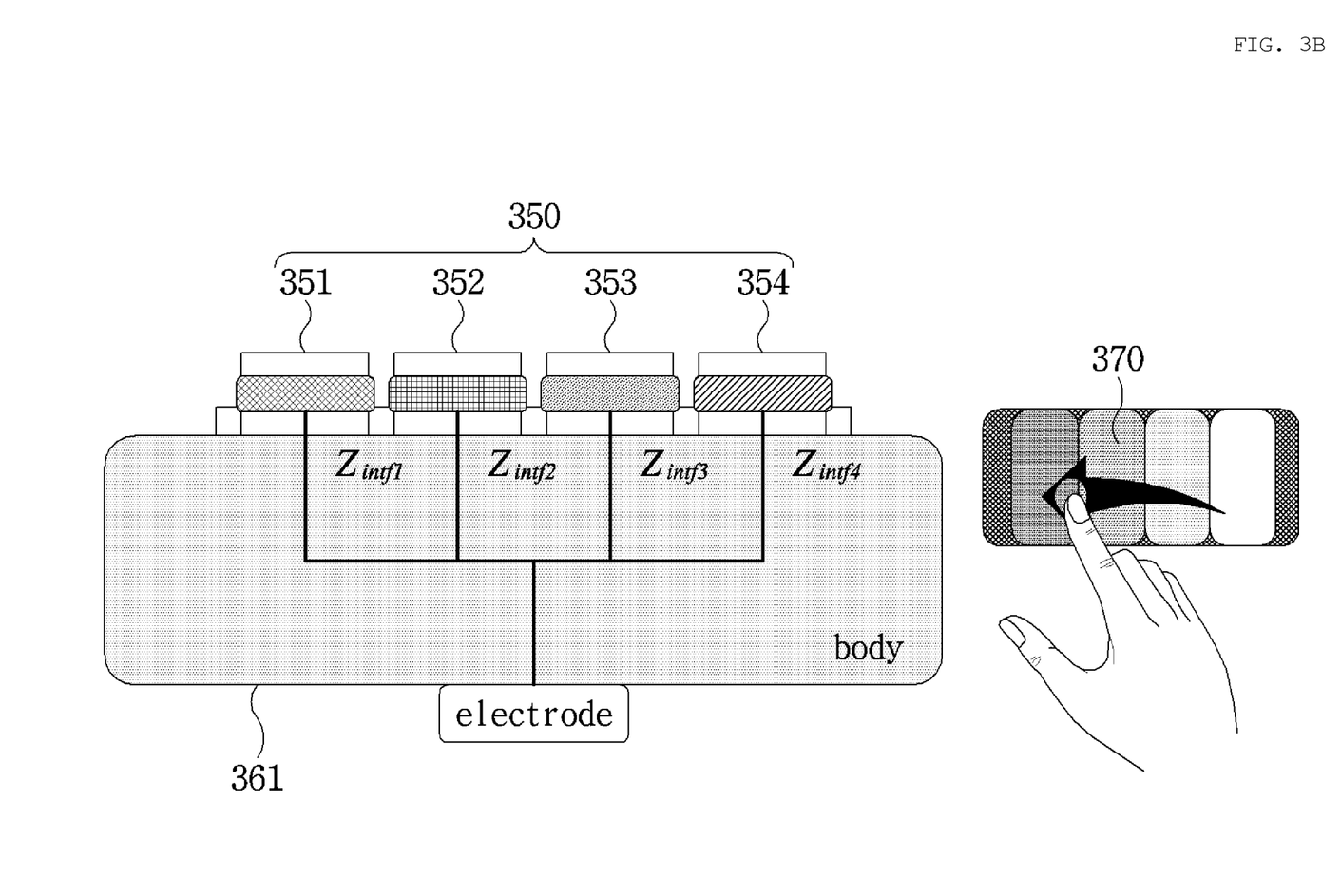
FIG. 3B is another exemplary view illustrating an arrangement of a body contact interface provided in a wearable device according to an embodiment of the present disclosure.

FIG. 3A is an exemplary view showing the arrangement of a body contact interface provided in a wearable device according to an embodiment of the present disclosure, and FIG. 3B is other exemplary view illustrating an arrangement of a body contact interface provided in a wearable device according to an embodiment of the present disclosure.

First, referring to FIG. 3A, a body contact interface 310 according to one embodiment of the present disclosure may have a plurality of body contact interfaces 311, 312, 313, and 314. The plurality of body contact interfaces 311, 312, 313, and 314 may be attached to various areas 321, 322, 323, and 324 of the user's body. The body of the user serves as an electrical conductor and the plurality of body contact interfaces 311, 312, 313, and 314 may be electrically connected to the signal processing unit through contact electrodes provided in the wearable device.

Preferably, the plurality of body contact interfaces 311, 312, 313, and 314 may have different impedance values. As a result, the wearable device may more accurately detect an area where a portion (e.g., a finger) of the user's body contacts.

Referring to FIG. 3B, the body contact interface 350 according to another embodiment of the present disclosure may have a plurality of body contact interfaces 351, 352, 353, and 354, the plurality of body contact interfaces 351, 352, 353, and 354 may be attached to one area 361 of the user's body. Likewise, the body of the user serves as an electrical conductor and the plurality of body contact interfaces 351, 352, 353, and 354 may be electrically connected to the signal processing unit through contact electrodes provided in the wearable device.

Preferably, the plurality of body contact interfaces 351, 352, 353, and 354 may have different impedance values. Thus, the wearable device may detect a gesture input (e.g., a drag input or the like) 370 caused by a contact of a portion of the user's body (e.g., a finger), and further accurately detect the direction or the like of the gesture input.

As another example, the body contact interface 310 according to the above-described embodiment and the body contact interface 350 according to another example may be combined. For example, in each of the variously divided areas 321, 322, 323, and 324 of user's body (See FIG. 3A), the plurality of body contact interfaces 351, 352, 353, and 354 (See FIG. 3B) may provided in place of the plurality of body contact interfaces 311, 312, 313, and 314.

As described above, the body contact interface 310 according to one embodiment and the body contact interface 350 according to another embodiment as described above may be combined to implement touch and gesture inputs using the body at various locations desired by the user.

Figure 4:
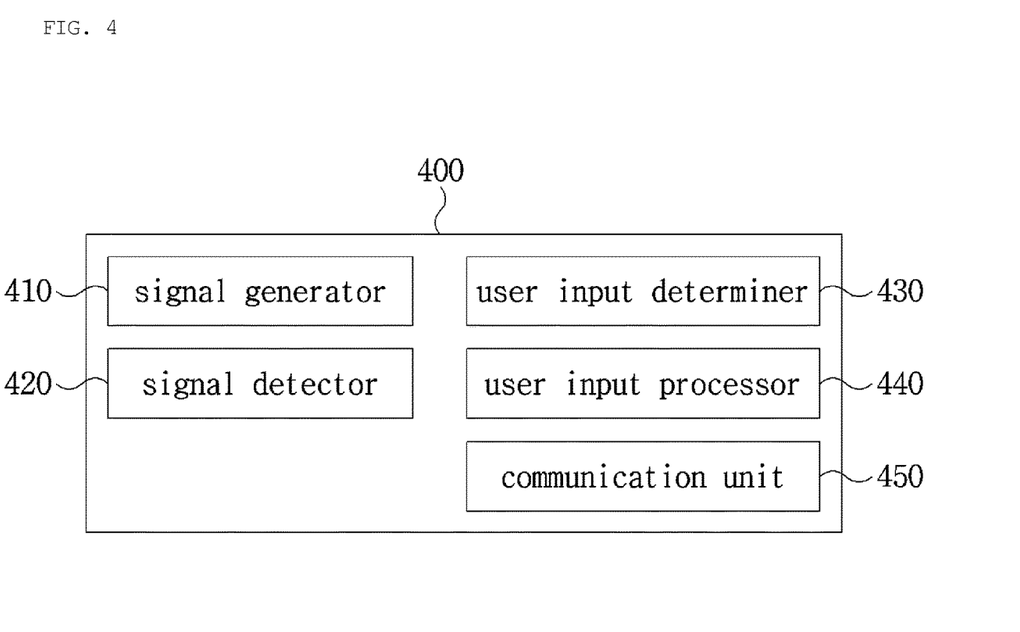
FIG. 4 is a block diagram showing a detailed configuration of a signal processing unit provided in a wearable device according to an embodiment of the present disclosure.

FIG. 4 is a block diagram showing a detailed configuration of a signal processing unit provided in a wearable device according to an embodiment of the present disclosure. Referring to FIG. 4, the signal processing unit 400 may include a signal generator 410, a signal detector 420, a user input determiner 430, and a user input processor 440.

The signal generator 410 may combine and output a plurality of fixed frequency component signals that are arbitrarily selected, and the signal detector 420 may detect distortion of amplitude and phase of each fixed frequency signal through time and frequency domain analysis for the signal detected in the circuit.

The signal generator 410 may digitally synthesize the plurality of fixed frequency components and convert them into a digital signal using a high-speed digital-analog converter DAC in order to generate a signal obtained by mixing the plurality of fixed frequency components.

As another example, the signal generator 410 may generate a signal mixed with frequency components by sequentially modulating the plurality of fixed frequency analog signals.

The signal detector 420 may use the amplitude and phase of each fixed frequency signal by transforming them into a digital value through an ADC (Analog-Digital Converter) and then applying time-frequency analysis techniques such as short time fast Fourier transform STFFT, Wavelet, and the like, or extracting changes in the amplitude and phase of individual frequencies using an analog signal of each frequency to be digitized.

The user input determiner 430 may analyze the characteristics of the signal detected by the signal detector 420 to determine the user input having the corresponding characteristic. For example, the user input determiner 430 may recognize user input from characteristics (changes in amplitude and phase) of individual frequency by using a method such as a k-nearest neighbor k-NN, a support vector machine SVM, a neural network NN, a linear discriminant analysis LDA, a Bayes network, and the like.

Further, the user input determiner 430 may process an operation of setting a user input corresponding to a movement of the user's body. For example, the user input determiner 430 may provide a user input interface for setting the user input. The user input interface for setting the user input may indicate to perform the user input (or a gesture), and in response thereto, the user may take an action to touch or drag one area of the body. Accordingly, the user input determiner 430 may detect characteristics (change in amplitude and phase) of a signal detected by an operation for the user to touch or drag one area of the body, and set the characteristics (change in amplitude and phase) of the detected signal to match the user input.

The user input processor 440 may process a function of the wearable device corresponding to the user input. The function of the wearable device corresponding to the user input may be set by a manufacturer or a user.

Hereinafter, an operation for setting the function of the wearable device corresponding to the user input via the user will be described.

The user input processor 440 provides a list of functions capable of being processed by the wearable device through the user input interface for setting the user input, whereby the user enables to select one from the list. Through the operation of the user input interface for setting the user input, the user input processor 440 may set the operational function of the wearable glass device corresponding to the user input (touching or dragging one area of the user's body).

A manner to allow the gesture and the area where the user input is generated to be corresponded to the operational function of the device may be applied variously using human proprioception. For example, the operational functions of the device may provide a more intuitive, distraction-free operating environment by causing intuitively emerging body areas and gestures to be matched to corresponding functions. Specifically, the operational function of the wearable device corresponding to the user input can be illustrated as shown in Table 1 below.

TABLE 1

| | | |
|---|---|---|
| Ear | Music playback/stop | Tap |
| | Music next/previous | Horizontal slide |
| | Mute | Covering |
| | Volume up/down | Vertical slide |
| | Take a call/hang up | Multi tap |
| | Start/finish voice recording | Long tap |
| Eye | Photographing | Tap |
| | Start/finish image(video) recording | Multi tap |

TABLE 1-continued

| | | |
|---|---|---|
| | Finding a thing(mobile phone) | Covering |
| | TV on/off | Long tap |
| | Illumination on/off | Double tap |
| | Controlling illumination | Vertical slide |
| Mouth | Start voice recognition | Tap |
| | Transmitting emergency message/call | Pinching |
| | Start/finishing voice recording | Long tap |
| | Rejecting a call | Covering |
| Hand | Start/finish exercise recording | Long tap |
| | Start/finish gesture recognition | Tap |
| | Presentation slide forwards and backwards | Horizontal slide |

In the embodiments of the present disclosure, the operational functions of the wearable device corresponding to the user inputs are exemplified, but the present disclosure is not limited thereto, and the user input areas may be variously applied, such as ears, temples, eyebrows, cheeks, nose, and the like that may be naturally touched using human proprioception.

Meanwhile, the wearable device according to an embodiment of the present disclosure may be connected to other devices (e.g., a portable terminal, a personal computer, a laptop computer, a tablet terminal, a TV, and the like), and may be provided to control an operation of other device using user inputs (or processing function corresponding to user input). For this, the signal processing unit 400 may include a communication unit 450 that may be connected to the other device through wired/wireless communication. As the signal processing unit 400 includes the communication unit, the user input processor 440 may determine whether the detected user input is an input for controlling the operation of the wearable device or a user input for controlling the function of another device connected through the communication unit 450.

If the detected user input is a user input for controlling the function of other device, the user input processor 440 may provide information indicating the detected user input to the other device through the communication unit 450.

As another example, the user input processor 440 may determine a processing function corresponding to the user input, and may provide information indicating the processing function corresponding to the user input to the other device through the communication unit 450.

On the other hand, since the impedance values measured in the wearable device according to an embodiment of the present disclosure may vary according to characteristics of individual body, signals generated and detected by the wearable device may be detected differently according to the user, and there may occur an error in recognition of the user input. Therefore, by setting the user input according to the impedance value appearing in the body of each user, the wearable device may more accurately detect the user input.

Figure 5:
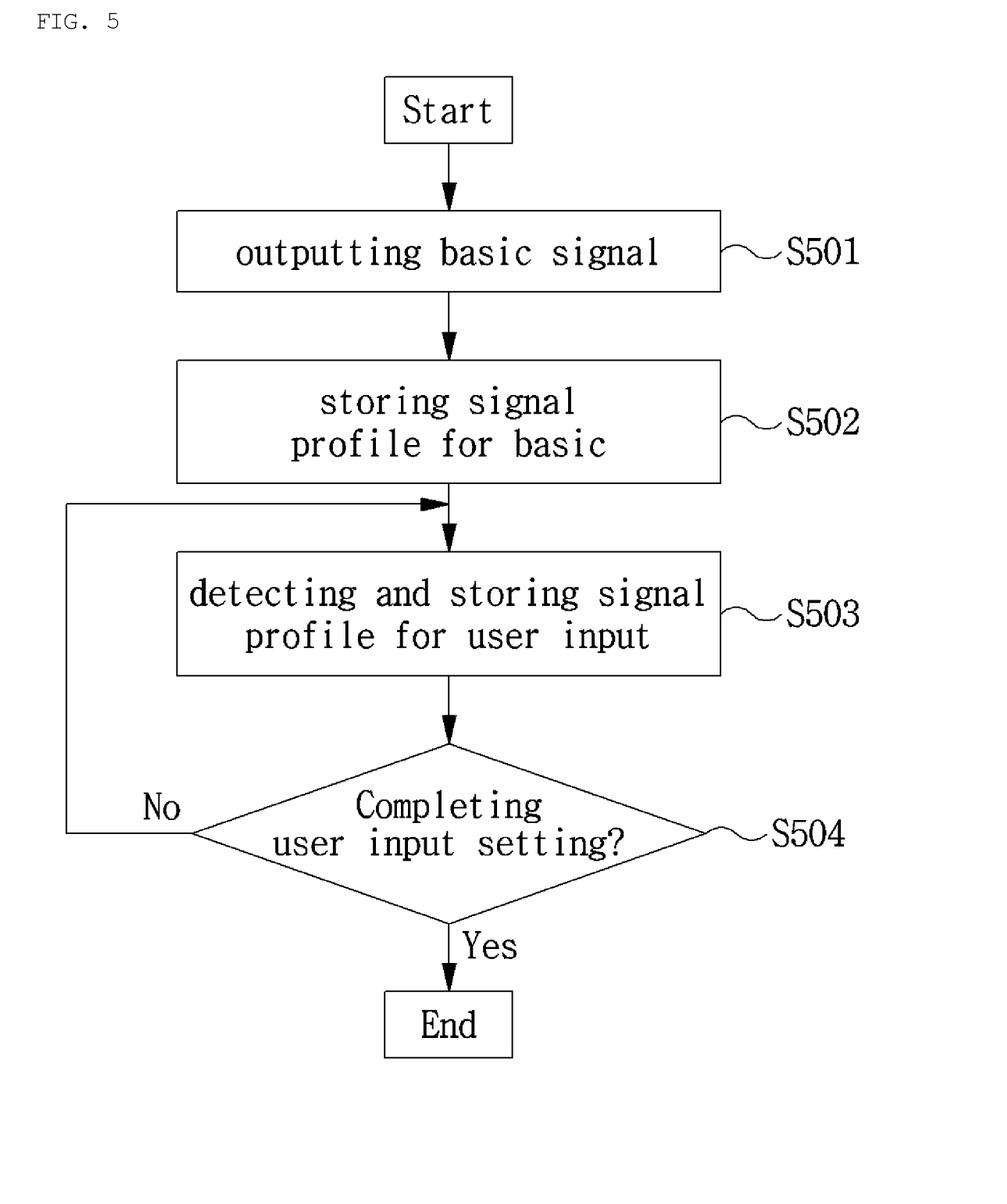
FIG. 5 is a flow chart illustrating a method of setting a user input in a wearable device according to an embodiment of the present disclosure.

FIG. 5 is a flow chart illustrating method of setting a user input in a wearable device according to an embodiment of the present disclosure.

The method of setting the user input in the wearable device may be performed by the signal processing unit provided in the wearable device described above.

First, in step S501, the signal processing unit outputs a basic signal obtained by mixing a plurality of fixed frequency component signals that are arbitrarily selected.

In step S502, the signal processing unit receives and stores the basic signal reflecting the impedance component formed through the contact electrode provided in the wearable device, the body contact interface, a body, and the like for a predetermined period of time. For example, the signal processing unit may process the time and frequency domain analysis of the received signal to store a signal profile for the amplitude and phase of each fixed frequency signal.

The step S502 needs to be performed in an environment in which one area (e.g., a hand, a finger, etc.) of the user's body does not contact another area. Accordingly, in step S502, the signal processing unit may output a message (or a user interface) instructing to maintain the environment in which one area of the user's body does not contact other areas, through a display or a speaker provided in the wearable device.

In step S503, the signal processing unit may detect and store a signal corresponding to the user input for a predetermined time. For example, the signal processing unit may determine characteristics such as amplitude and phase distortion of each fixed frequency signal by performing the time and frequency domain analysis on the signal that is detected for the predetermined time when user input is generated, and store the corresponding characteristics as a signal profile corresponding to the user input.

In step S503, the signal processing unit may output a message (or a user interface) guiding the user to take an action corresponding to the user input, through a display or a speaker provided in the wearable device.

Further, various user inputs may exist, and the above-described step S503 may be repeatedly performed until all the signal profiles for various user inputs are detected and stored (S504).

Through the user input setting method described above, the signal processing unit may store a signal profile corresponding to at least one user input and use the stored signal profile to detect the user input.

Hereinafter, an operation in which the wearable device detects the user input using the signal profile corresponding to the user input will be described.

Figure 6:
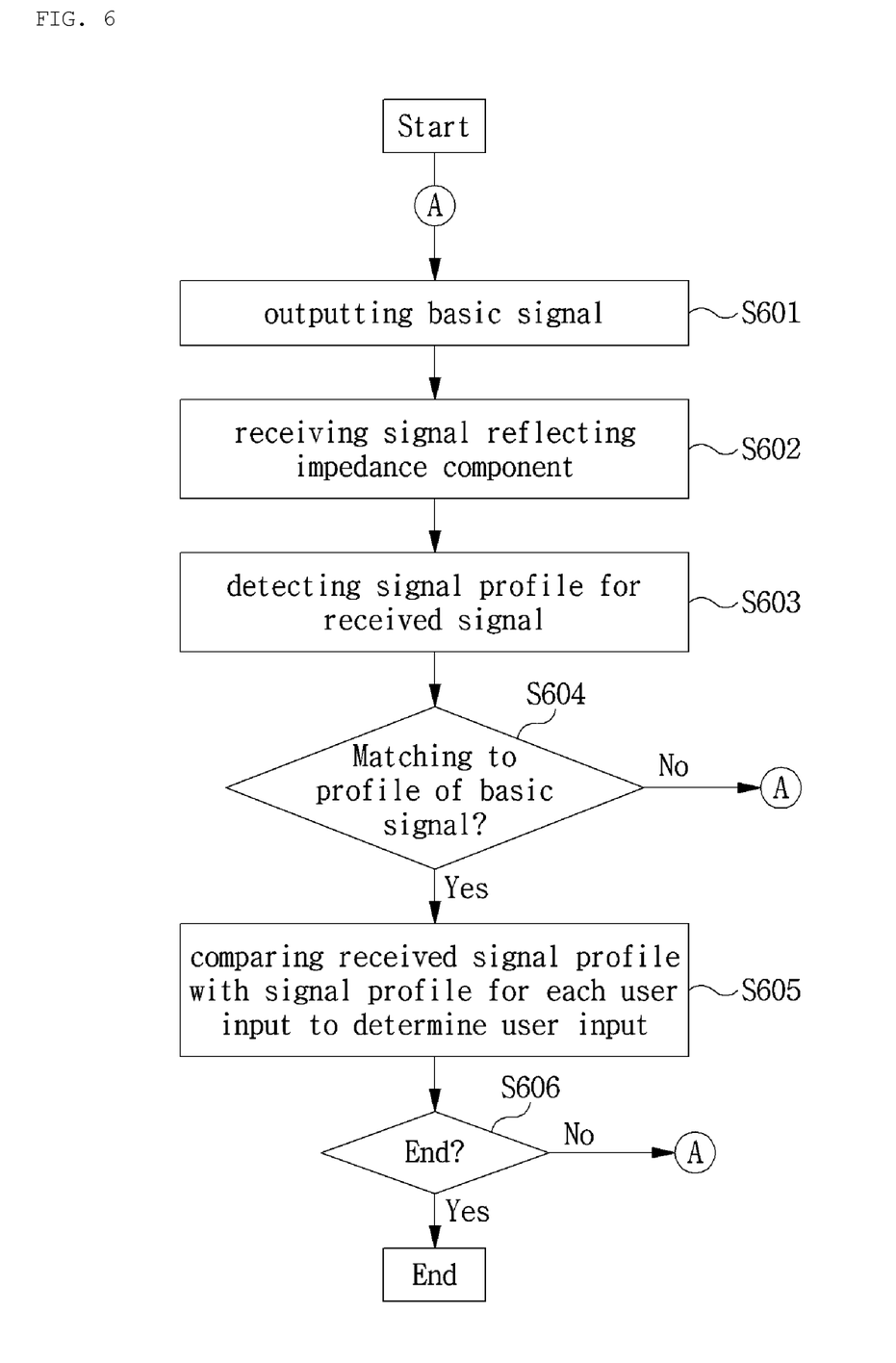
FIG. 6 is a flow chart illustrating a method of determining a user input in a wearable device according to an embodiment of the present disclosure.

FIG. 6 is a flow chart illustrating a method of determining a user input in a wearable device according to an embodiment of the present disclosure.

The method of detecting the user input in the wearable device may be performed by the signal processing unit provided in the wearable device.

First, in step S601, the signal processing unit outputs a basic signal obtained by mixing a plurality of fixed frequency component signals that are arbitrarily selected.

Then, in step S602, the signal processing unit receives a signal reflecting an impedance component formed through the contact electrode provided in the wearable device, the body contact electrode, a body, and the like.

In step S603, the signal processing unit processes the time and frequency domain analysis of the received signal to detect a signal profile for the amplitude and phase of each fixed frequency signal.

In step S604, the signal processing unit compares the detected signal profile with a profile of the basic signal. When the detected signal profile has other characteristics than the basic signal, the signal processing unit proceeds to step S605.

In step S605, the signal processing unit compares the detected signal profile with a stored signal profile for each user input, thereby detecting a signal profile having a matching characteristic and determining a corresponding user input.

In step S605, the signal processing unit may determine a user input corresponding to the detected signal profile using the similarity of the signal. Specifically, the signal processing unit computes the similarity between the detected signal profile and the stored signal profile for each user input using a method such as a k-nearest neighbor (kNN), a support vector machine (SVM), a neural network (NN), a linear discriminant analysis (LDA), Bayes network, and the like. Then, the user input profile having the highest similarity value may be detected among the computed similarity values. In order to determine the validity of the profile of the detected user input, it is checked whether the similarity value exceeds a predetermined threshold value, and if the similarity value is within a range of the predetermined threshold value, it is determined to detect the corresponding user input. On the other hand, if the similarity value exceeds the predetermined threshold value, the detected signal profile may be determined as an invalid input.

Although an embodiment of the present disclosure has exemplified to determine a user input corresponding to the detected signal profile using the similarity, the present disclosure is not limited thereto, and various methods of detecting the predetermined signal corresponding to the input signal may be applied.

The wearable device described above may include a wrist-worn device. For example, the wrist-worn device may be provided with a contact electrode in an area in contact with a body of a user, that is, a backside portion of a display provided in the wrist-worn device, and a body contact interface in one area of a band provided in the wrist-worn device. Further, the body contact interface may be variously attached to areas of the user's ears, eyes, arms, and the like. Further, the body contact interface may be configured by having a type of a body adhesive patch such as a disposable band, having a form in which the circuit itself is transferred to a skin in the form of a copy picture, by imprinting on the user's skin using a functional dye, or by providing the circuit in the body wearable device such as a pair of glasses, earrings, necklaces, and the like to be in contact with the body.

The user's satisfaction and convenience may be improved by creating a user input that allows the user to control the electronic device using user's body, without the need for the user to provide the user input directly to the electronic device to control the electronic device.

Further, it is possible to provide an environment in which an electronic device may be more intuitively controlled and a user interface that is distraction-free upon controlling an electronic device, by setting a user input that directly makes contact a portion of body corresponding to each function of the electronic device by reflecting human proprioception.

Although the exemplary methods of this disclosure are represented by a series of steps for clarity of explanation, they are not intended to limit the order in which the steps are performed, and if necessary, each step may be performed simultaneously or in a different order. In order to implement the method according to the present disclosure, it is possible to include other steps to the illustrative steps additionally, exclude some steps and include remaining steps, or exclude some steps and include additional steps.

The various embodiments of the disclosure are not intended to be exhaustive of all possible combinations, but rather to illustrate representative aspects of the disclosure, and the features described in the various embodiments may be applied independently or in a combination of two or more.

In addition, various embodiments of the present disclosure may be implemented by hardware, firmware, software, or a combination thereof. In the case of hardware implementation, it may be implemented by one or more application specific integrated circuits ASICs, digital signal processors DSPs, digital signal processing devices DSPDs, programmable logic devices PLDs, field programmable gate arrays FPGAs, a general processor, a controller, a microcontroller, a microprocessor, or the like.

The scope of the present disclosure encompasses all types of software or machine-executable instructions (e.g., operating system, applications, firmware, programs and the like) to allow operations to be executed on the device or computer according to various embodiments, and non-transitory computer-readable medium in which such software or instructions are saved to be executable on the device or computer.

The invention claimed is:

1. An electronic device, comprising:
   a plurality of contact electrodes, each of which has one end contacted with a user's body to be electrically connected to the user's body;
   one or more body contact interfaces electrically connected to the user's body and electrically connected to the plurality of contact electrodes through the user's body, each of the one or more body contact interfaces having a predetermined impedance value; and
   a signal processing unit connected to the other end of each of the plurality of contact electrodes to form a circuit through the plurality of contact electrodes, the one or more body contact interfaces, and the user's body, the signal processing unit determining a user input corresponding to an impedance characteristic of the circuit,
   wherein each of the one or more body contact interfaces includes:
      a first electrode plate;
      a second electrode plate spaced apart from the first electrode plate by a predetermined distance;
      a changing unit provided between the first electrode plate and the second electrode plate to be electrically connected to the first electrode plate and the second electrode plate, and having the predetermined impedance value; and
      an attachment member fixing the second electrode plate to the user's body.

2. The electronic device of claim 1, wherein the one or more body contact interfaces have different unique impedance values.

3. The electronic device of claim 1, wherein the attachment member causes the second electrode plate to be closely fixed to the user's body.

4. The electronic device of claim 1, wherein the attachment member causes the second electrode plate to be fixed to an object closely attached to the user's body.

5. The electronic device of claim 1, wherein the signal processing unit includes:
   a signal generator for generating a predetermined signal to be output to the circuit through the contact electrodes;
   a signal detector for detecting a signal of the circuit through the contact electrodes; and
   a user input determiner for determining a characteristic of the signal detected by the signal detector and determining a user input corresponding to the detected signal.

6. The electronic device of claim 5, wherein the user input determiner detects a characteristic of a signal for at least one user input, stores the characteristic of the signal for the at least one user input, and determines a user input having a characteristic corresponding to the characteristic of the signal detected by the signal detector.

7. The electronic device of claim 1, wherein the user's body is divided into a plurality of predetermined areas, and the one or more body contact interfaces are provided in one or more areas of the plurality of predetermined areas, respectively.

8. The electronic device of claim 1, wherein the user's body is divided into a plurality of predetermined areas, and the one or more body contact interfaces are provided in at least one area of the plurality of predetermined areas.

9. The electronic device of claim 1, wherein the signal processing unit further includes a communication unit for processing wired/wireless communication with an external device, and provides information indicating the user input to the external device through the communication unit.

10. The electronic device of claim 1, wherein the signal processing unit further includes a communication unit for processing wired/wireless communication with an external device, and provides information indicating a function corresponding to the user input to the external device through the communication unit.

11. An electronic device, comprising:
   a plurality of contact electrodes, each of which has one end contacted with a user's body to be electrically connected to the user's body;
   one or more body contact interfaces electrically connected to the user's body and electrically connected to the plurality of contact electrodes through the user's body, each of the one or more body contact interfaces having a predetermined impedance value; and
   a signal processing unit connected to the other end of each of the plurality of contact electrodes to form a circuit through the plurality of contact electrodes, the one or more body contact interfaces, and the user's body, the signal processing unit determining a user input corresponding to an impedance characteristic of the circuit,
   wherein the signal processing unit includes:
      a signal generator for generating a predetermined signal to be output to the circuit through the contact electrodes;
      a signal detector for detecting a signal of the circuit through the contact electrodes; and
      a user input determiner for determining a characteristic of the signal detected by the signal detector and determining a user input corresponding to the detected signal,
      wherein the user input determiner selects a characteristic of a signal for one user input having a highest similarity with the characteristic of the signal detected by the signal detector and compares a similarity between the characteristic of the signal detected by the signal detector and the characteristic of the signal for the at least one user input selected with a predetermined threshold value, thereby determining the user input.

12. A method of processing a signal of an electronic device, the method comprising:
   generating a predetermined signal;
   outputting the predetermined signal to a circuit formed by a plurality of contact electrodes, one or more body contact interfaces, and a user's body;
   detecting a signal reflecting an impedance characteristic provided in the circuit; and
   determining a user input corresponding to a characteristic of the detected signal,
   wherein the determining comprises:
      selecting a characteristic of a signal for at least one user input having a highest similarity with the characteristic of the detected signal;
      comparing the similarity between the characteristic of the detected signal and the characteristic of the signal for the at least one user input selected with a predetermined threshold value; and determining that the user input is valid when the similarity is within a range of the predetermined threshold value.

13. The method of claim 12, further comprising:
generating a basic signal;
outputting the basic signal;
detecting and storing a signal reflecting an impedance characteristic for the basic signal; and
detecting and storing at least one signal characteristic reflecting an impedance characteristic for at least one user input.

14. The method of claim 12, wherein the determining the user input further includes detecting an area where the user input is generated, when the user's body is divided into a plurality of predetermined areas and the one or more body contact interfaces are provided in one or more of the plurality of predetermined areas, respectively.

15. The method of claim 12, wherein the determining the user input further includes detecting occurrence of a drag input and a direction in which the drag input occurs, when the user's body is divided into a plurality of predetermined areas and a plurality of body contact interfaces is provided in at least one of the plurality of predetermined areas.

16. The method of claim 12, further comprising:
providing information indicating the user input to an external device through a communication unit processing wired/wireless communication with the external device.

17. The method of claim 12, further comprising:
determining a function corresponding to the user input; and
performing the function corresponding to the user input.

18. The method of claim 12, further comprising:
providing information indicating a function corresponding to the user input to an external device through a communication unit that processes wired/wireless communication with the external device.

\* \* \* \* \*